United States Patent

Kyogoku et al.

Patent Number: 5,509,967
Date of Patent: Apr. 23, 1996

[54] HEAT TREATMENT APPARATUS

[75] Inventors: Mitsusuke Kyogoku; Osamu Honma, both of Tama, Japan

[73] Assignee: ASM Japan K.K., Tokyo, Japan

[21] Appl. No.: 256,505

[22] PCT Filed: Nov. 12, 1993

[86] PCT No.: PCT/JP93/01661

§ 371 Date: Sep. 19, 1994

§ 102(e) Date: Sep. 19, 1994

[87] PCT Pub. No.: WO94/11899

PCT Pub. Date: May 26, 1994

[30] Foreign Application Priority Data

Nov. 13, 1992  [JP]  Japan .................................. 4-327616

[51] Int. Cl.$^6$ .................................................. C23C 16/00
[52] U.S. Cl. ........................... 118/724; 118/715; 432/241
[58] Field of Search .................................. 118/724, 725, 118/715; 432/241, 242

[56] References Cited

U.S. PATENT DOCUMENTS

| | | | |
|---|---|---|---|
| 4,989,540 | 2/1991 | Fuse | 118/719 |
| 4,992,301 | 2/1991 | Shishiguchi | 427/51 |
| 5,000,682 | 3/1991 | Heidt | 432/241 |
| 5,015,330 | 5/1991 | Okumura | 156/643 |
| 5,127,365 | 7/1992 | Koyama | 118/724 |
| 5,225,378 | 7/1993 | Ushikawa | 437/233 |
| 5,239,614 | 8/1993 | Ueno | 392/416 |
| 5,273,586 | 12/1993 | Kim | 118/723 E |
| 5,279,670 | 1/1994 | Watanabe | 118/725 |
| 5,308,955 | 5/1994 | Watanabe | 219/390 |

FOREIGN PATENT DOCUMENTS

| | | | |
|---|---|---|---|
| 1-194415 | 8/1989 | Japan . | |
| 103934 | 4/1990 | Japan | 118/724 |
| 3-233294 | 10/1991 | Japan . | |
| 53125 | 2/1992 | Japan | 118/724 |
| 133317 | 5/1992 | Japan | 118/724 |
| 4-186616 | 7/1992 | Japan . | |

*Primary Examiner*—R. Bruce Breneman
*Assistant Examiner*—Jeffrie R. Lund
*Attorney, Agent, or Firm*—Knobbe, Martens, Olson & Bear

[57] ABSTRACT

A reduction in the air tightness of a reaction chamber of an apparatus due to thermal degradation of a vacuum seal at the connection seal between the reaction chamber and a manifold is prevented. Contamination of the inside of the chamber from particles produced from heating members of the apparatus is reduced. The wall of the reaction chamber extends to a location sufficiently spaced from the lower end of the heater surrounding the reaction chamber. An exhaust port is provided in the wall to exhaust the reaction chamber.

2 Claims, 2 Drawing Sheets

PRIOR ART

HEAT TREATMENT APPARATUS

FIELD OF THE INVENTION

The present invention relates to a heat treatment apparatus in which objects are processed with heat and a predetermined reactant gas flow within an evacuated chamber.

BACKGROUND OF THE PRESENT INVENTION

FIG. 1 illustrates a partial cross-sectional view of a vertical-type heat treatment apparatus known in the art. The heat treatment apparatus includes a reaction chamber 1 having a wall 2, the chamber being made of a high purity material such as quartz and the like. The wall 2 is formed in a cylindrical shape which has a closed end and an open end, the open end being connected to a manifold 4. The connection between the open end of the reaction chamber wall 2 and the manifold 4 is provided with a vacuum seal, such as an O-ring 11 or the like. Most of the wall 2 is surrounded by heater 13 for heating the reaction chamber 1.

A compartment tube 3 mounts on the manifold 4, the compartment tube having a length that reaches to approximately the top of the reaction chamber 1. Also, an inlet 9 is provided in the manifold 4 for introducing a reactant gas below the compartment tube 3. An outlet 10 in the manifold 4 is provided for exhausting reaction gas above a position where the compartment tube 3 connects to the manifold.

Inside the compartment tube 3, an object supporting boat 5 supports a plurality of objects 7, such as semiconductor wafers, with a vertical space therebetween. A boat table 6 is provided for supporting the boat 5, and for loading and unloading the assembly into the reaction chamber 1. A typical treatment process for the objects 7 is to form a thin film by a chemical vapor growth, an annealing, and the like. A flange 8 is provided below the manifold 4 for shielding an opening of the manifold. An elevator mechanism (not shown) moves the flange 8 vertically within an elevator chamber (also not shown). The flange 8 can be vertically elevated by the motion of the elevator mechanism. The boat table 6 mounted on the flange 8, and the boat 5 are thus loaded into and unloaded from the reaction chamber 1. When the flange 8 contacts a shoulder formed under the manifold 4, the reaction chamber is sealed, such as with an O-ring 12, and is separated completely from the exterior environment.

The typical treatment is performed by introducing the reaction gas from the inlet 9 after placing the objects 7 in the reaction chamber 1 and forming a seal. The reaction gas goes upwardly through the inside of the compartment tube 3 past the objects 7 within the boat 5 where a predetermined reaction is accomplished. The reaction gas then passes through the opening of the upper part of the compartment tube 3 and downwardly through a space between an outer wall of the compartment tube and an inner surface of the reaction chamber wall 2. The reaction gas is then exhausted from the outlet 10 provided in the manifold 4.

In the prior art, as mentioned above, a vacuum seal member, such as an O-ring 11 and the like, is provided at the connection between the reaction chamber wall 2 and the manifold 4. Such a vacuum seal member is easily degraded causing particles in the reaction chamber to increase, and, the CVD apparatus and the quality of CVD film is thus degraded.

Moreover, the manifold 4 is typically made of stainless steel which degrades, thus producing metal molecules which spread from the manifold heated to a high temperature. The metal contaminates the objects 7, thus considerably worsening the characteristics of the processed objects.

SUMMARY OF THE INVENTION

The present invention resolves two problems as mentioned above at the same time, and provides high quality production. The objective of the present invention can be accomplished by locating the connection between the reaction chamber wall and the manifold apart from the heater by making the whole length of the reaction chamber longer, and providing an outlet for exhausting the reaction gas in the wall of the reaction chamber.

DESCRIPTION OF THE PREFERRED EMBODIMENTS

Figure 1:
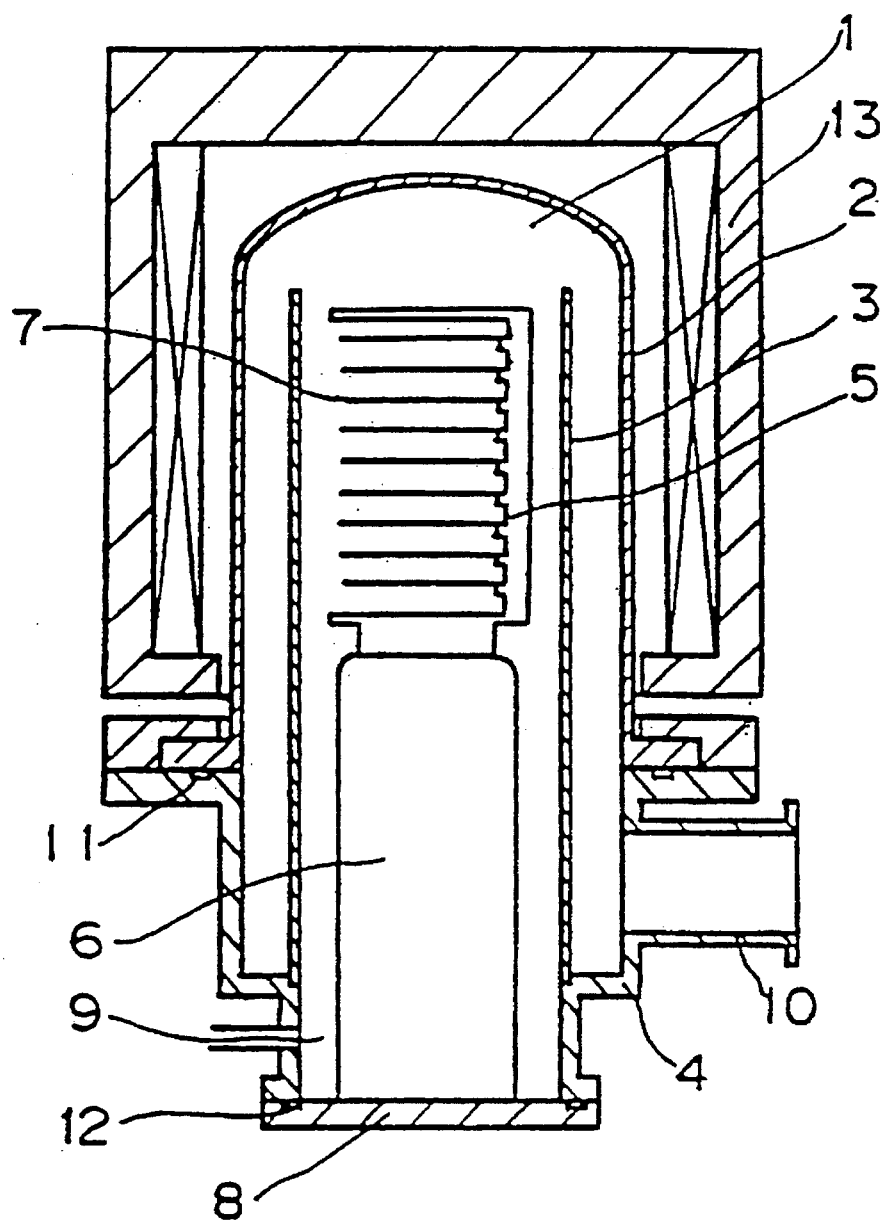
FIG. 1 is a partial cross-sectional view of a heat treatment apparatus in the prior art.
Figure 2:
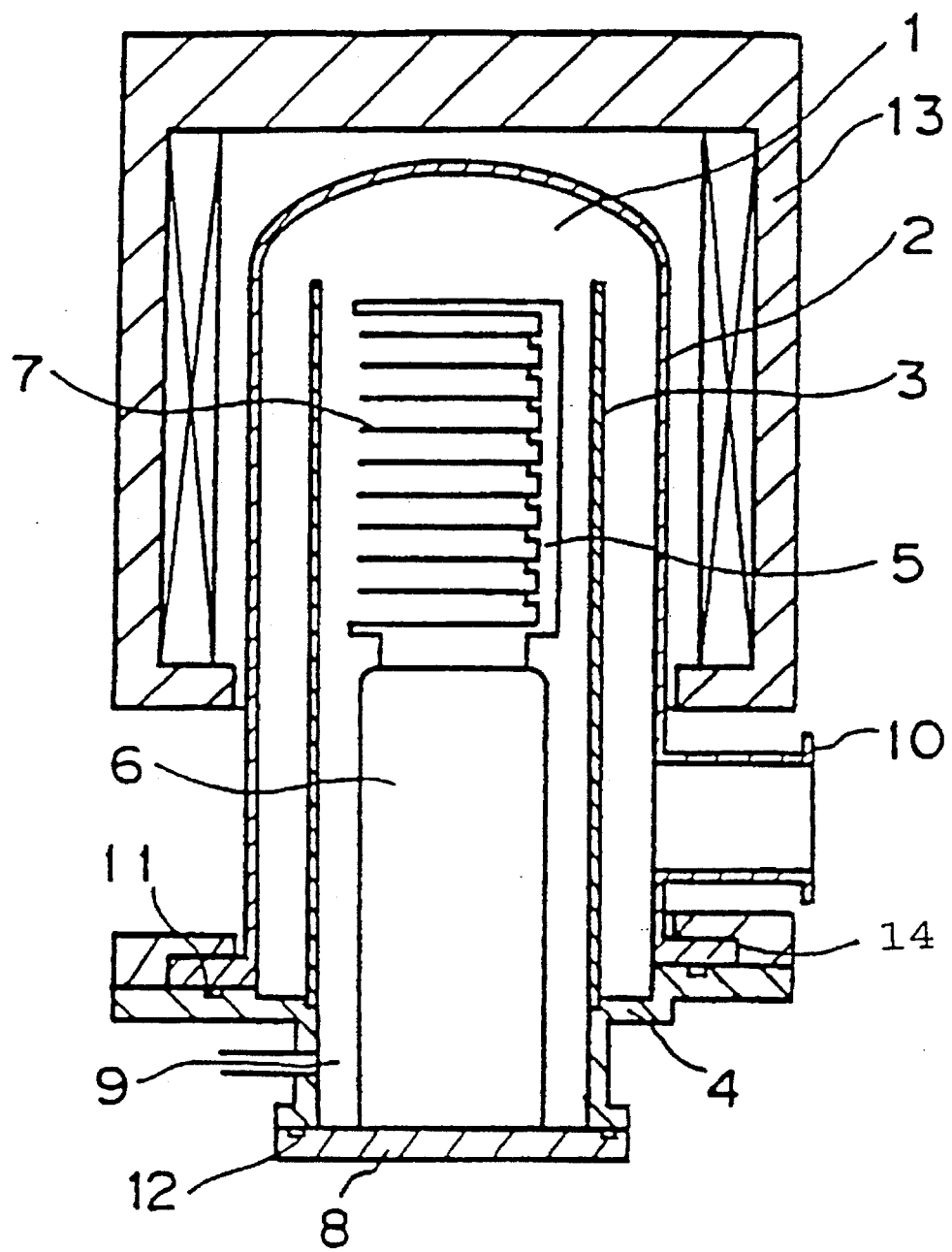
FIG. 2 is a partial cross-sectional view of a heat treatment apparatus in accordance with the present invention.

With reference to FIG. 2, an embodiment of the present invention is shown. A reaction chamber 2 comprises a cylinder shaped wall 2 having an upper closed end and a lower open end. The reaction chamber is typically made of a high quality material such as quartz, and the like. A shoulder 14 is formed around the lower open end of the reaction chamber wall 2, the shoulder being connected to a shoulder of a manifold 4. A vacuum seal member, such as an O-ring 11, and the like, is provided at the connection between the reaction chamber wall 2 and the manifold 4 to enhance the air tightness of the inside of the reaction chamber. A compartment tube 3 extends from the manifold 4 upward to approximately the top of the reaction chamber 1. An inlet 9 provided below the compartment tube 3 in the manifold 4 supplies reaction gas to the reaction chamber 1.

Objects 7 are placed in an object supporting boat 5 provided on a boat table 6 with a vertical space provided between each object. A flange 8 mounts on the lower end of the boat table 6, the flange being connected to the lower end of the manifold 4 during the heat treatment of the objects so that the reaction chamber 1 is sealed. The upper end of the object supporting boat 5 is positioned below the upper end of the compartment tube 3. A heater 13 surrounds the reaction chamber wall 2 to accelerate a reaction between the objects 7 and the reaction gas. An outlet 10 is provided in the reaction chamber wall 2 below the heater for exhausting the reaction gas.

In the present invention, the reaction gas introduced from the inlet 9 goes upwardly through the inside of the compartment tube 3 to the position of the objects 7. The objects 7 are processed in a predetermined reaction with the high temperature. The reaction gas then goes out from an opening of the upper end of the compartment tube 3 and downwardly between an outer wall of the compartment tube 3 and an inner surface of the reaction chamber wall 2. The reaction gas is then exhausted from the outlet 10.

In an apparatus according to the present invention, the distance from the heater to the connection between the reaction chamber partition and the manifold is increased, and the thermal degradation of a vacuum seal member at that connection is sufficiently reduced.

Moreover, a surface temperature of the manifold is reduced, and the exhaust outlet is provided in the wall of the reaction chamber above the manifold so that the risk of exposing the manifold to the high temperature reaction gas is extremely small. Further, the metal contamination of the objects being treated is considerably reduced.

Therefore, the objective of the present invention is accomplished, and high quality treated objects are obtained.

We claim:

1. A heat treatment apparatus, which is part of low pressure CVD apparatus, comprising:
    a wall of a reaction chamber made of a high purity material such as quartz:
    a heater for heating said reaction chamber formed by said wall, said heater being positioned around said wall;
    a manifold connected to one open end of said wall;
    a flange configured to shield an opening of said manifold, the flange defining a vacuum chamber with said wall and said manifold; and
    an outlet provided on said wall between said heater and the open end of said wall for evacuating the inside of said reaction chamber.

2. A heat treatment apparatus according to claim 1, wherein the location of the connection between said manifold and the open end of said wall is sufficiently distant from said heater so that the connection is not degraded by heat and the reaction chamber is not contaminated.

* * * * *